United States Patent [19]

Cooperman et al.

[11] Patent Number: 5,045,730
[45] Date of Patent: Sep. 3, 1991

[54] ELECTRICAL CIRCUITRY PROVIDING COMPATIBILITY BETWEEN DIFFERENT LOGIC LEVELS

[75] Inventors: Michael Cooperman, Framingham; Richard Sieber, Attleboro, both of Mass.

[73] Assignee: GTE Laboratories Incorporated, Waltham, Mass.

[21] Appl. No.: 455,533

[22] Filed: Dec. 22, 1989

[51] Int. Cl.$^5$ ............... H03K 19/092; H03K 19/094; H03K 19/003; H03K 19/086
[52] U.S. Cl. .................................. 307/475; 307/443; 307/542; 307/451; 307/473
[58] Field of Search ............... 307/443, 473, 362, 270, 307/475, 448, 542, 547, 548, 544, 451

[56] References Cited

U.S. PATENT DOCUMENTS

| 4,521,696 | 6/1985 | Raghunathan | 307/362 |
| 4,656,375 | 4/1987 | Lauffer | 307/475 |
| 4,704,549 | 11/1987 | Sanwo | 307/475 |
| 4,849,660 | 7/1989 | Hayashi | 307/475 |
| 4,888,500 | 12/1989 | Nicollini et al. | 307/475 |
| 4,890,016 | 12/1989 | Tanaka | 307/542 |
| 4,890,019 | 12/1989 | Hoyte | 307/443 |
| 4,900,954 | 2/1990 | Franz et al. | 307/455 |
| 4,912,347 | 3/1990 | Morris | 307/443 |
| 4,943,741 | 7/1990 | Estrada et al. | 307/455 |

Primary Examiner—Stanley D. Miller
Assistant Examiner—David R. Bertelson
Attorney, Agent, or Firm—Victor F. Lohmann, III

[57] ABSTRACT

Electrical circuitry providing a compatible interface between ECL logic level of −1.6 and −0.8 volts and CMOS logic levels of 0 and +5 volts. Voltage sources of −3.7 and +1.3 volts are provided for supplying operating voltages to the CMOS circuitry in order to set the threshold voltage CMOS inverters at −1.2 volts, the threshold voltage of ECL logic circuits.

7 Claims, 2 Drawing Sheets

FIG. 4

ELECTRICAL CIRCUITRY PROVIDING COMPATIBILITY BETWEEN DIFFERENT LOGIC LEVELS

BACKGROUND OF THE INVENTION

This invention relates to electrical circuitry. More particularly, it is concerned with logic circuits having different logic levels and with interface arrangements between logic circuits having different logic levels.

Two widely used, well-known logic systems are ECL (emitter coupled logic) and CMOS (complementary metal oxide semiconductor) logic systems. The logic levels for ECL logic are −1.6 volt and −0.8 volt and for CMOS the logic levels are 0 volts and +5 volts. The threshold voltage for CMOS logic, that is the voltage at which a CMOS logic circuit triggers from one operating state to another, is +2.5 volts. Since this voltage is outside the operating range of ECL logic, CMOS logic circuitry is not directly compatible with ECL circuitry.

The circuit diagram of FIG. 1 illustrates the conventional technique heretofore employed to couple ECL logic circuitry to CMOS logic circuitry. An array of CMOS circuitry is indicated by the dashed line 10 in FIG. 1. The CMOS logic consists of an array of inverter circuits each including a P-type MOS transistor and its complement, an N-type MOS transistor, connected in series between +5 volts and ground. The gates of each pair are connected together and an output is taken from their common juncture. As is well-known, the output of each inverter stage is the inversion of its input. In order to change the logic levels from the ECL logic levels of −1.6 volts and −0.8 volts so as to accommodate the 0 and −5 volt logic levels of CMOS logic a conventional ECL/MOS translator 11 is connected at the input of the CMOS circuitry 10. At the output of CMOS circuitry an MOS/ECL translator 12 converts the 0/+5 volt CMOS logic levels to the −1.6/−0.8 volt ECL logic levels. In addition to requiring the +5 volt power supply used with the MOS circuitry, the translators also require −5 volts. Furthermore the translators consume physical space and consume power. They also introduce delay and power distortion.

SUMMARY OF THE INVENTION

Electrical circuitry in accordance with the present invention includes input circuit means coupled to a source of reference potential for producing at its output an input signal at a first input voltage or at a second input voltage with respect to the reference potential. Switching circuit means has an input connected directly to the output of the input circuit means and also has an output. A first voltage source produces a first supply voltage different from the reference potential and is connected to the switching circuit means. A second voltage source produces a second supply voltage different from the reference potential and is also connected to the switching circuit means. The switching circuit means is operable in a first operating state when the voltage at its input is greater than a threshold voltage which is between the first and second supply voltages, and the switching circuit means is operable in a second operating state when the voltage at its input is less than the threshold voltage. The first and second supply voltages of the first and second voltage sources, respectively, set the threshold voltage between the first input voltage and the second input voltage.

In accordance with another aspect of the invention electrical circuitry in accordance with the invention includes input circuit means coupled to a source of reference potential for producing at its output an input signal at a first input voltage with respect to the reference potential or at a second input voltage with respect to the reference potential. Switching circuit means has an input connected directly to the output of the input circuit means and has an output. A first voltage source produces a first supply voltage and is connected to the switching circuit means. A second voltage source produces a second supply voltage and is connected to the switching circuit means. The switching circuit means is operable in a first operating state when the voltage at its input is greater than a threshold voltage between the first and second supply voltages, and the switching circuit is operable in a second operating state when the voltage at its input is less than the threshold voltage. The threshold voltage of the switching circuit means is set outside the range between the first and second input voltages if either of the supply voltages is at the reference potential. The first and second supply voltages of the first and second voltage sources, respectively, are selected to set the threshold voltage between the first input voltage and the second input voltage.

For a better understanding of the present invention, together with other and further objects, advantages, and capabilities thereof, reference is made to the following disclosure and appended claims in connection with the above-described drawings.

DETAILED DESCRIPTION

Figure 1:
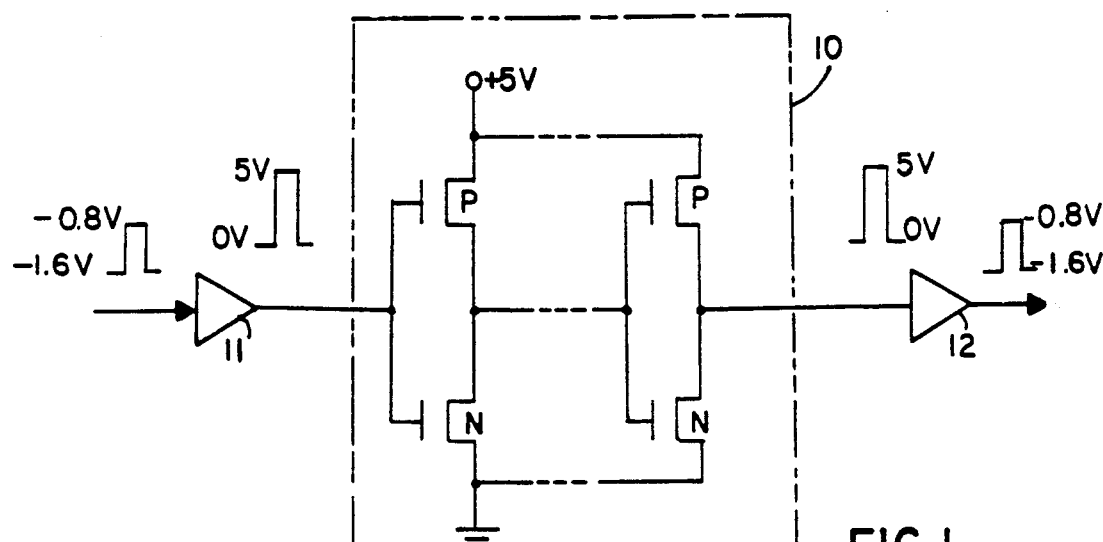
FIG. 1 is a schematic circuit diagram of electrical circuitry in accordance with the prior art and is discussed hereinabove.
Figure 2:
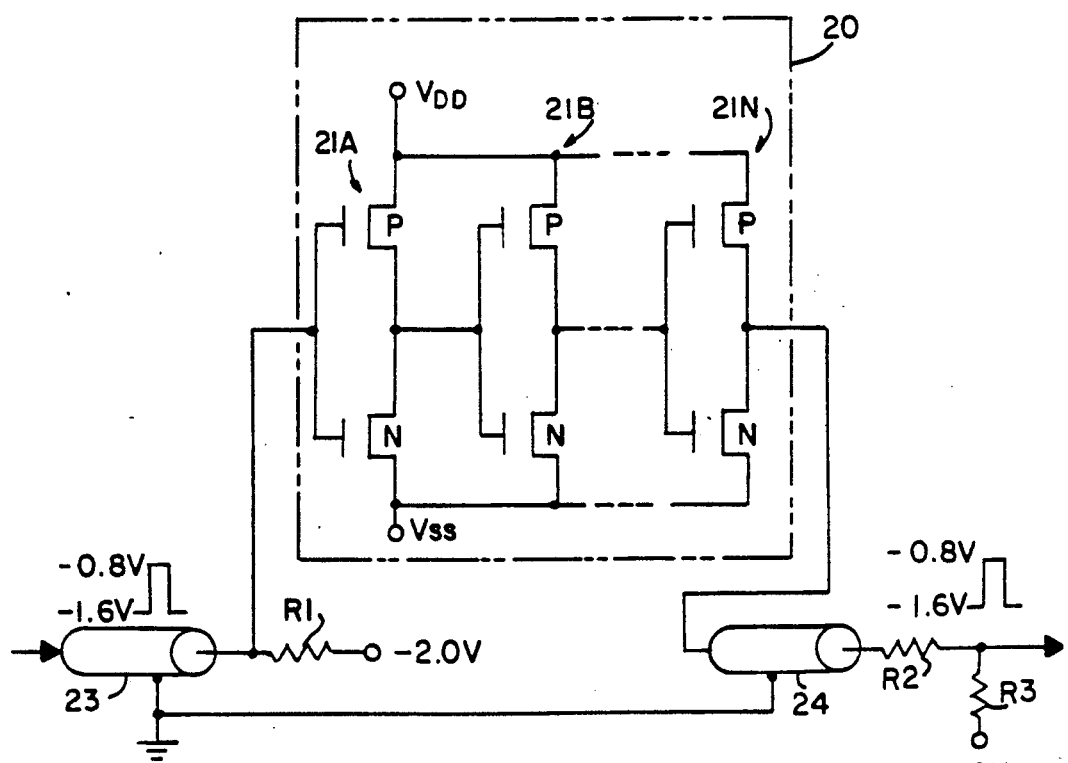
FIG. 2 is a schematic circuit diagram of circuitry illustrating the present invention.

FIG. 2 illustrates an improved arrangement for coupling ECL logic circuits to CMOS logic circuits. CMOS logic circuitry 20 indicated by the portion encompassed by the dashed lines 20 may be any of various types of CMOS circuitry for example a crosspoint switching array as described in U.S. Pat. No. 4,818,988 to Cooperman and Sieber. As in the case of the prior art circuitry of FIG. 1 the circuitry includes an array of CMOS inverter circuits 21A, 21B, . . . , 21N. Each inverter has a P-type MOS transistor and an N-type MOS transistor connected in series between voltage sources $V_{DD}$ and $V_{SS}$. As is well-understood the gates of the pair of inverter transistors are connected together to provide an input and the juncture between them provides an output. When the voltage at the input is above the threshold voltage, which is midway between the $V_{DD}$ and $V_{SS}$ voltage levels, the P-type transistor is nonconducting and the N-type transistor is conducting, producing a voltage at the output which is relatively low. When the voltage at the input is below the threshold voltage, the P-type transistor conducts and the N-type transistor is nonconducting producing a voltage at the output which is relatively high.

ECL logic levels of −1.6 volt and −0.8 volts are provided from ECL circuitry over a 50 ohm impedance line 23 which is grounded and terminated with a 50 ohm resistor R1 connected to −2.0 volts in the conventional manner. This arrangement is standard for ECL interface and termination.

In accordance with the present invention the input transmission line 23 is connected directly to the input of the first inverter stage 21A of the MOS circuitry 20. The voltage source $V_{DD}$ is +1.3 volts and the voltage source $V_{SS}$ is −3.7 volts. This arrangement shifts the input threshold voltage for the MOS circuitry to −1.2 volts. Thus the MOS circuitry is made compatible with the ECL logic level since −1.2 volts is midway between the ECL logic levels of −1.6 volt and −0.8 volt.

It can be seen that by choosing appropriate values for supply voltages $V_{DD}$ and $V_{SS}$ the input threshold voltage, which is halfway between them, may be shifted to be compatible with other logic levels. More specifically, as is well-known in conventional usage when $V_{DD}$ is +5 volts and $V_{SS}$ is at ground potential the input threshold voltage is +2.5 volts. If $V_{DD}$ is chosen as +2.5 volts and $V_{SS}$ is −2.5 volts, the input threshold level would be at ground potential or 0 volts. In the particular instance under discussion for ECL logic levels $V_{DD}$ is selected at +1.3 volts and $V_{SS}$ is selected at −3.7 volts establishing an operating voltage of 5 volts while setting the input threshold voltage at −1.2 volts.

Figure 3:
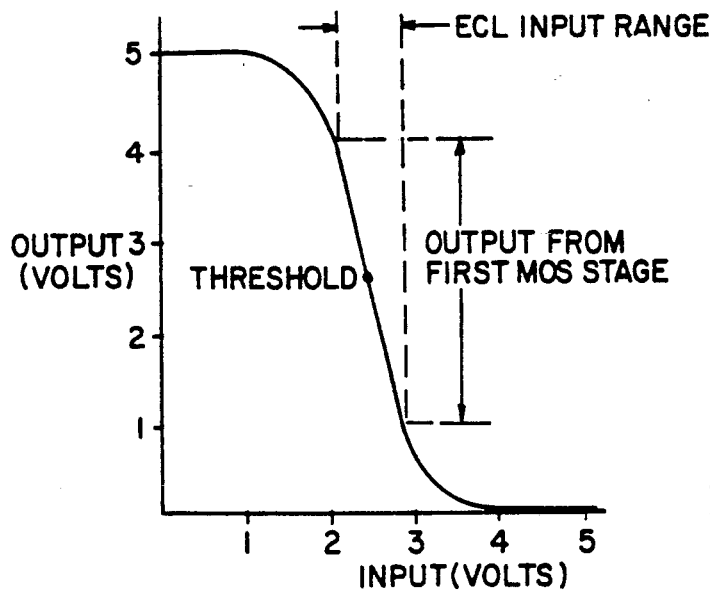
FIG. 3 is a curve illustrating the operating characteristics of a CMOS inverter and is useful in describing the operation of the circuitry of FIG. 2.

Since the ECL logic range between −1.6 volts and −0.8 volt is only 800 millivolts (400 millivolts each side of the threshold), the first MOS inverter stage 21A produces an output variation of only 3 volts rather than the full 5 volts. This situation is illustrated by the inverter characteristic curve of FIG. 3. Thus, in employing circuitry in accordance with the present invention for interfacing ECL logic directly with MOS logic, a second inverter stage 21B is required in order to obtain the full output voltage range of 5 volts.

As illustrated in FIG. 2, the output from the MOS circuit array is connected to a grounded 50 ohm transmission line 24 which is terminated in a series arrangement of a 30 ohm resistance R2 and a 20 ohm resistance R3 connected to a −1.2 volt source. The output is taken at the juncture of resistances R2 and R3. With conventional CMOS devices the output resistance of the last inverter stage 21N is 70 ohms, producing a 2 volt output swing into the 50 ohm transmission line 24. The output is taken at the junction of resistance R2 and R3. The output arrangement attenuates the output voltage swing from the MOS circuitry to 800 millivolts (centered around −1.2 volts) compatible with ECL.

Figure 4:
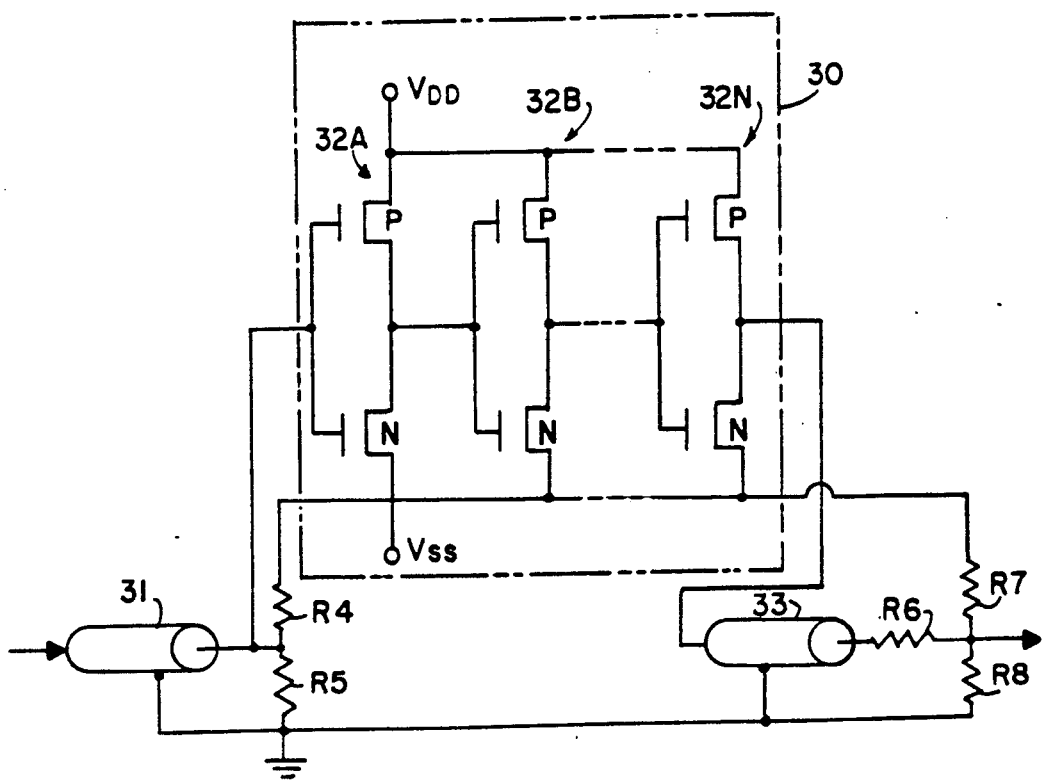
FIG. 4 is a schematic circuit diagram of simplified circuitry in accordance with the present invention.

FIG. 4 illustrates a simplification of the circuitry of FIG. 2. The $V_{DD}$ voltage for the MOS circuit array 30 is +1.3 volts and the $V_{SS}$ voltage is −3.7 volts. The output of a grounded 50 ohm transmission line 31 from ECL logic circuitry is connected directly to the input of the first inverter stage 32A. The transmission line 31 is also connected to a voltage divider of resistances R4 and R5 having values of 93 ohms and 109 ohms, respectively, connected between $V_{SS}$ and ground. This arrangement is a Thevenin equivalent of a 50 ohm impedance connected to −2.0 volts. (FIG. 2) The output of the MOS circuit array 30 is connected through a grounded 50 ohm transmission line 33 and a resistance R6 to a voltage divider of resistances R7 and R8 connected between voltage source $V_{SS}$ and ground. The output for ECL logic levels is taken from the juncture of the three resistances. The values of the resistances R6, R7, and R8 are 30 ohms, 62 ohms, and 30 ohms, respectively. This arrangement is a Thevenin equivalent of the 50 ohm impedance connected to −1.2 volts in FIG. 2. Thus the circuit of FIG. 4 provides a simplified arrangement requiring no voltage sources other than the $V_{DD}$ and $V_{SS}$ voltage supplies employed to operate the CMOS logic circuitry.

The circuit arrangement in accordance with the present invention provides a simplified and space saving arrangement for compatibly interfacing ECL and CMOS logic circuitry. No complex, space-consuming circuitry such as ECL/MOS and MOS/ECL translators nor additional power supplies are required.

While there has been shown and described what is considered a preferred embodiment of the present invention, it will be obvious to those skilled in the art that various changes and modifications may be made therein without departing from the invention as defined by the appended claims.

What is claimed is:

1. Electrical circuitry including:
   input circuit means coupled to a source of reference potential for producing at its output an input signal at a first input voltage or at a second input voltage with respect to said reference potential;
   switching circuit means having an input connected directly to the output of said input circuit means and having an output;
   a first voltage source for producing a first supply voltage different from the reference potential connected to said switching circuit means;
   a second voltage source for producing a second supply voltage different from the reference potential connected to said switching circuit means;
   said switching circuit means being operable in a first operating state when the voltage at its input is greater than a threshold voltage between said first and second supply voltages, and said switching circuit means being operable in a second operating state when the voltage at its input is less than the threshold voltage;
   the first and second supply voltages of said first and second voltage sources, respectively, setting said threshold voltage between said first input voltage and said second input voltage;
   a resistance coupling arrangement between the source of reference potential and said first voltage source; and
   the output of said input circuit means being connected to the input of the switching circuit means and to a point in the resistance coupling arrangement to establish an impedance match between the input circuit means and the switching circuit means.

2. Electrical circuitry in accordance with claim 1 including
   output circuit means coupled to the source of reference potential, having its input coupled to the output of said switching circuit means, and having an output connection;
   said output circuit means being operable to produce a voltage at its output connection equal to said first input voltage when the switching circuit means is in one of said operating states, and being operable to produce a voltage at its output connection equal to said second input voltage when the switching circuit means is in the other of said operating states.

3. Electrical circuitry including:

input circuit means coupled to a source of reference potential for producing at its output an input signal at a first input voltage or at a second input voltage with respect to said reference potential;

switching circuit means having an input connected directly to the output of said input circuit means and having an output;

a first voltage source for producing a first supply voltage different from the reference potential connected to said switching circuit means;

a second voltage source for producing a second supply voltage different from the reference potential connected to said switching circuit means;

said switching circuit means being operable in a first operating state when the voltage at its input is greater than a threshold voltage between said first and second supply voltages, and said switching circuit means being operable in a second operating state when the voltage at its input is less than the threshold voltage;

the first and second supply voltages of said first and second voltage sources, respectively, setting said threshold voltage between said first input voltage and said second input voltage;

said switching circuit means including first and second inverters;

the input of the first inverter being connected directly to the output of the input circuit means;

the output of the first inverter being connected directly to the input of the second inverter whereby when the first inverter is in a first conducting condition the second inverter is in a second conducting condition, and when the first inverter is in the second conducting condition the second inverter is in the first conducting condition, and whereby the output of the second inverter is at the first supply voltage when the second inverter is in the first conducting condition and is at the second supply voltage when the second inverter is in the second conducting condition.

4. Electrical circuitry including:

input circuit means coupled to a source of reference potential for producing at its output an input signal at a first input voltage with respect to said reference potential or at a second input voltage with respect to said reference potential;

switching circuit means having an input connected directly to the output of said input circuit means and having an output;

a first voltage source for producing a first supply voltage connected to said switching circuit means;

a second voltage source for producing a second supply voltage connected to said switching circuit means;

said switching circuit means being operable in a first operating state when the voltage a its input is greater than a threshold voltage between said first and second supply voltages, and said switching circuit means being operable in a second operating state when the voltage at its input is less than said threshold voltage;

said threshold voltage of said switching circuit means being set outside the range between said first and second input voltages if either of said supply voltages is at said reference potential;

said first and second supply voltages of said first and second voltage sources, respectively, being selected to set the threshold voltage between said first input voltage and said second input voltage;

said switching circuit means including first and second inverters;

the input of the first inverter being connected directly to the output of the input circuit means;

the output of the first inverter being connected directly to the input of the second inverter whereby when the first inverter is in a first conducting condition the second inverter is in a second conducting condition, and when the first inverter is in the second conducting condition the second inverter is in the first conducting condition, and whereby the output of the second inverter is at the first supply voltage when the second inverter is in the first conducting condition and is at the second supply voltage when the second inverter is in the second conducting condition.

5. Electrical circuitry including:

input circuit means coupled to ground potential for producing at its output an input signal at a first input voltage or at a second input voltage with respect to ground potential;

switching circuit means comprising an inverter of a complementary pair of MOS transistors connected in series between a first voltage source for producing a first supply voltage and a second voltage source for producing a second supply voltage;

the gates of said MOS transistors being connected directly together and to the output of the input circuit means;

said inverter being in a first conducting condition when the voltage differential between said first supply voltage and said second supply voltage is a predetermined operating voltage and the voltage at the gates is greater than a threshold voltage which is midway between said first supply voltage and said second supply voltage, and said inverter being in a second conducting condition when the voltage differential between said first supply voltage and said second supply voltage is said predetermined operating voltage and the voltage at the gates is less than said threshold voltage;

said threshold voltage of said inverter being set outside the range between said first and second input voltages if either of said supply voltages is at ground potential;

said first and second supply voltages of said first and second voltage sources, respectively, being selected to set the threshold voltage between said first input voltage and said second input voltage;

one of said MOS transistors being a P-type transistor and the other an N-type transistor;

said P-type transistor being connected directly to the second voltage source and the N-type transistor being connected directly to the first voltage source, the second supply voltage being positive with respect to the first supply voltage;

output circuit means coupled to ground potential, having its input coupled to the output of an inverter of said switching circuit means, and having an output connection;

said output circuit means being operable to produce a voltage at its output connection equal to said first input voltage when the inverter connected to its input is in the first conducting condition, and being operable to produce a voltage at its output connection equal to said second input voltage when the inverter connected to its input is in the second conducting condition;

a resistance coupling arrangement between ground potential and said first voltage source;

the output of said input circuit means being connected to the gates of said transistors and to a point in the resistance coupling arrangement to establish an impedance match between the input circuit means and the switching circuit means.

6. Electrical circuitry in accordance with claim 5 wherein said switching circuit means includes first and second inverters, each inverter comprising a complementary pair of MOS transistors connected in series between said first voltage source and said second voltage source;

the gates of the MOS transistors of the first inverter being connected directly together and to the output of the input circuit means, and the gates of the MOS transistors of the said inverter being connected directly together and to the output of the first inverter;

when the first inverter is in the first conducting condition the second inverter is in the second conducting condition, and when the first inverter is in the second conducting condition the second inverter is in the first conducting condition; and the output of the second inverter is at the first supply voltage when the second inverter is in the first conducting condition and is at the second supply voltage when the second inverter is in the second conduction condition.

7. Electrical circuitry in accordance with claim 6 wherein said input circuit means comprises an emitter-coupled logic circuit, said first input voltage is $-1.6$ volts, and said second input voltage is $-0.8$ volt with respect to ground potential; and said first supply voltage is $-3.7$ volts, said second supply voltage is $+1.3$ volts, and said threshold voltage is $-1.2$ volts with respect to ground potential.

* * * * *